US009391646B2

(12) United States Patent
Naiss et al.

(10) Patent No.: US 9,391,646 B2
(45) Date of Patent: Jul. 12, 2016

(54) JOINT SOURCE-CHANNEL ENCODING AND DECODING FOR COMPRESSED AND UNCOMPRESSED DATA

(71) Applicant: Samsung Electronics Co., Ltd., Suwon-Si, Gyeonggi-Do (KR)

(72) Inventors: Iddo Naiss, Ramat Gan (IL); Uri Beitler, Ramat Gan (IL); Jun Jin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 203 days.

(21) Appl. No.: 14/224,572

(22) Filed: Mar. 25, 2014

(65) Prior Publication Data

US 2015/0280751 A1  Oct. 1, 2015

(51) Int. Cl.
*G06F 11/00* (2006.01)
*H03M 13/00* (2006.01)
*H03M 13/11* (2006.01)
*G06F 11/10* (2006.01)

(52) U.S. Cl.
CPC ....... *H03M 13/6312* (2013.01); *G06F 11/1004* (2013.01); *H03M 13/1102* (2013.01)

(58) Field of Classification Search
CPC ........... G06F 11/1076; G06F 11/1004; H03M 13/1102; H03M 13/6312
USPC .................................................. 714/758, 774
See application file for complete search history.

(56) References Cited

U.S. PATENT DOCUMENTS

| | | | |
|---|---|---|---|
| 5,418,532 A | 5/1995 | Lei | |
| 5,774,081 A | 6/1998 | Cheng et al. | |
| 5,809,176 A | 9/1998 | Yajima | |
| 6,557,137 B1 | 4/2003 | Park et al. | |
| 6,892,343 B2 | 5/2005 | Sayood et al. | |
| 7,882,421 B2 | 2/2011 | Oguz et al. | |
| 2003/0034911 A1* | 2/2003 | Martini | H03M 13/09 341/173 |
| 2004/0101205 A1 | 5/2004 | Dhavala et al. | |
| 2008/0069242 A1* | 3/2008 | Xu | H04N 19/395 375/240.24 |
| 2010/0306619 A1* | 12/2010 | Yang | G06F 11/1072 714/758 |
| 2015/0235647 A1* | 8/2015 | Zopf | G10L 19/008 704/229 |

OTHER PUBLICATIONS

Fresia et al., Joint Source/Channel Coding With Low Density Parity Check Matrices, Dec. 31, 2009, pp. 1-20.
Pettijohn et al., Joint Source/Channel Coding Using Arithmetic Codes, IEEE Transactions on Communications, vol. 49, No. 5, May 2001.

(Continued)

*Primary Examiner* — David Ton
(74) *Attorney, Agent, or Firm* — Harness, Dickey & Pierce, P.L.C.

(57) ABSTRACT

A memory controller includes a joint source-channel encoder circuit and a joint source-channel decoder circuit. The joint source-channel encoder circuit source encodes received data independent of whether the received data is compressible data, performs error correction coding on the source encoded data, and stores the source encoded data in a memory device. The joint source-channel decoder circuit performs source decoding of the data read from the memory device between iterations of error correction coding of the read data, and outputs the read data to at least one of a buffer memory and a storage device interface. The joint source-channel decoder circuit performs the source decoding of the read data independent of whether the read data is compressed data.

19 Claims, 8 Drawing Sheets

(56) References Cited

OTHER PUBLICATIONS

Tingjun et al., A Joint Source-Channel Coding Scheme Using Low-Density Parity-Check Codes and Error Resilient Arithmetic Codes, 2007 IEEE, pp. 673-677.

Grangetto et al., Decoder-Driven Adaptive Distributed Arithmetic Coding, ICIP 2008, IEEE, pp. 1128-1131.

Artigas et al., Overlapped Arithmetic Codes With Memory, EUSIPCO 2008, Switzerland, 2008.

Hekland, A Review of Joint Source-Channel Coding, NTNU, Feb. 2004, pp. 1-10.

* cited by examiner

JOINT SOURCE-CHANNEL ENCODING AND DECODING FOR COMPRESSED AND UNCOMPRESSED DATA

BACKGROUND

Joint source-channel coding involves source (compression) coding and channel (error correction) coding. One example of source coding is arithmetic coding. Arithmetic coding is a form of entropy coding used in lossless data compression. In one example, arithmetic coding encodes/compresses an entire message into a single fraction n where ($0.0 \leq n < 1.0$). When a bit string is arithmetically encoded, frequently used characters are stored with fewer bits and not-so-frequently occurring characters are stored with more bits, which results in fewer total bits.

If data is uncompressible, significant expansion of the data may occur during arithmetic encoding. To avoid this expansion, conventionally, source encoding of such data is generally bypassed.

SUMMARY

Example embodiments provide methods and/or apparatuses for joint source-channel coding (encoding and/or decoding) of both compressible and uncompressible data. At least some example embodiments limit the expansion caused by the source coding while still using arithmetic coding on uncompressible data to assist with error correction at the decoder.

At least one example embodiment utilizes a distributed arithmetic coder without intent to compress the data, but to identify and assist with error correction.

According to at least one example embodiment, a memory controller includes a joint source-channel encoder circuit. The joint source-channel encoder circuit is configured to: source encode received data independent of whether the received data is compressible data; perform error correction coding on the source encoded data; and store the source encoded data in a memory device.

The joint source-channel encoder circuit may be further configured to: determine whether the received data is compressible data; and encode the received data according to a distributed source encoding algorithm if the received data is uncompressible data.

The joint source-channel encoder circuit may be further configured to: generate compression indicator information for the received data, the compression indicator information indicating whether the received data is compressible data; and store the compression indicator information in association with the source encoded data in the memory device.

The compression indicator information may be a flag or check bit that is set or reset according to whether the received data is compressible data.

The joint source-channel encoder circuit may be further configured to: source encode the received data according to a first source encoding algorithm; and determine whether the received data is compressible data based on a comparison between a size of the source encoded data and a size of the received data.

The joint source-channel encoder circuit may be further configured to determine that the received data is uncompressible data if the size of the source encoded data is greater than or equal to the size of the received data.

The joint source-channel encoder circuit may be further configured to source encode the received data according to a second source encoding algorithm if the received data is uncompressible data. The second source encoding algorithm may be a distributed source encoding algorithm.

The first source encoding algorithm may be an arithmetic encoding algorithm. The error correction coding may be low-density parity check (LDPC) correction coding.

At least one other example embodiment provides a memory controller including a joint source-channel decoder circuit. The joint source-channel decoder circuit is configured to: read data from a memory device; perform source decoding of the read data between iterations of error correction coding of the read data, the source decoding of the read data being performed independent of whether the read data is compressed data; and output the read data to at least one of a buffer memory and a storage device interface.

The joint source-channel decoder circuit may be further configured to perform one of a nonoverlapped source decoding algorithm and a distributed source decoding algorithm between iterations of the error correction coding based on whether the read data is compressed data.

The joint source-channel decoder circuit may be further configured to perform the distributed source decoding algorithm between iterations of the error correction coding if the read data is not compressed data.

The distributed source decoding algorithm may be a distributed arithmetic source decoding algorithm using a model in which the error interval is greater than the overlapped interval.

The joint source-channel decoder circuit may be further configured to determine whether the read data is compressed data based on compression indicator information stored in association with the read data, the compression indicator information indicating whether the read data is compressed data.

The compression indicator information may be a flag or a check bit.

According to at least one other example embodiment, a memory controller includes: a joint source-channel encoder circuit and a joint source-channel decoder circuit. The joint source-channel encoder circuit is configured to: source encode received data independent of whether the received data is compressible data; perform error correction coding on the source encoded data; and store the source encoded data in a memory device. The joint source-channel decoder circuit is configured to: read data from the memory device; perform source decoding of the read data between iterations of error correction coding of the read data, the source decoding of the read data being performed independent of whether the read data is compressed data; and output the read data to at least one of a buffer memory and a storage device interface.

At least one other example embodiment provides a storage device. The storage device includes: a memory device; and a memory controller including a joint source-channel decoder circuit. The joint source-channel decoder circuit is configured to: read data from the memory device; perform source decoding of the read data between iterations of error correction coding of the read data, the source decoding of the read data being performed independent of whether the read data is compressed data; and output the read data to at least one of a buffer memory and a storage device interface The memory controller may further include a joint source-channel encoder circuit. The joint source-channel encoder circuit may be configured to: source encode received data independent of whether the received data is compressible data; perform error correction coding on the source encoded data; and store the source encoded data in the memory device.

The memory device may be a nonvolatile memory device, such as a flash memory device or the like.

At least one other example embodiment provides a method comprising: reading data from a memory device; performing source decoding of the read data between iterations of error correction coding of the read data, the source decoding of the read data being performed independent of whether the read data is compressed data; and outputting the read data to at least one of a buffer memory and a storage device interface.

At least one other example embodiment provides a method comprising: source encoding received data independent of whether the received data is compressible data; performing error correction coding on the source encoded data; and storing the source encoded data in a memory device.

BRIEF DESCRIPTION OF THE DRAWINGS

Example embodiments will become more appreciable through the description of the drawings in which.

DETAILED DESCRIPTION

Example embodiments will now be described more fully with reference to the accompanying drawings. Many alternate forms may be embodied and example embodiments should not be construed as limited to example embodiments set forth herein. In the drawings, like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., nonvolatile memories universal flash memories, universal flash memory controllers, nonvolatile memories and memory controllers, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

According to at least one example embodiment, a memory (or device) controller includes a joint source-channel encoder circuit and a joint source-channel decoder circuit.

The joint source-channel encoder circuit source encodes received data regardless or independent of whether the received data is compressible data to assist with error correction at the decoder circuit. The source encoding is one of normal (nonoverlapped) source encoding and distributed (overlapped) source encoding.

The joint source-channel decoder circuit performs source decoding of data from a memory device between iterations of error correction coding of the read data to assist with error correction of the read data. The joint source-channel decoder circuit performs source decoding of the read data regardless or independent of whether the read data is compressed data. The source decoding is one of normal (nonoverlapped) source decoding and distributed (overlapped) source decoding.

Figure 1:
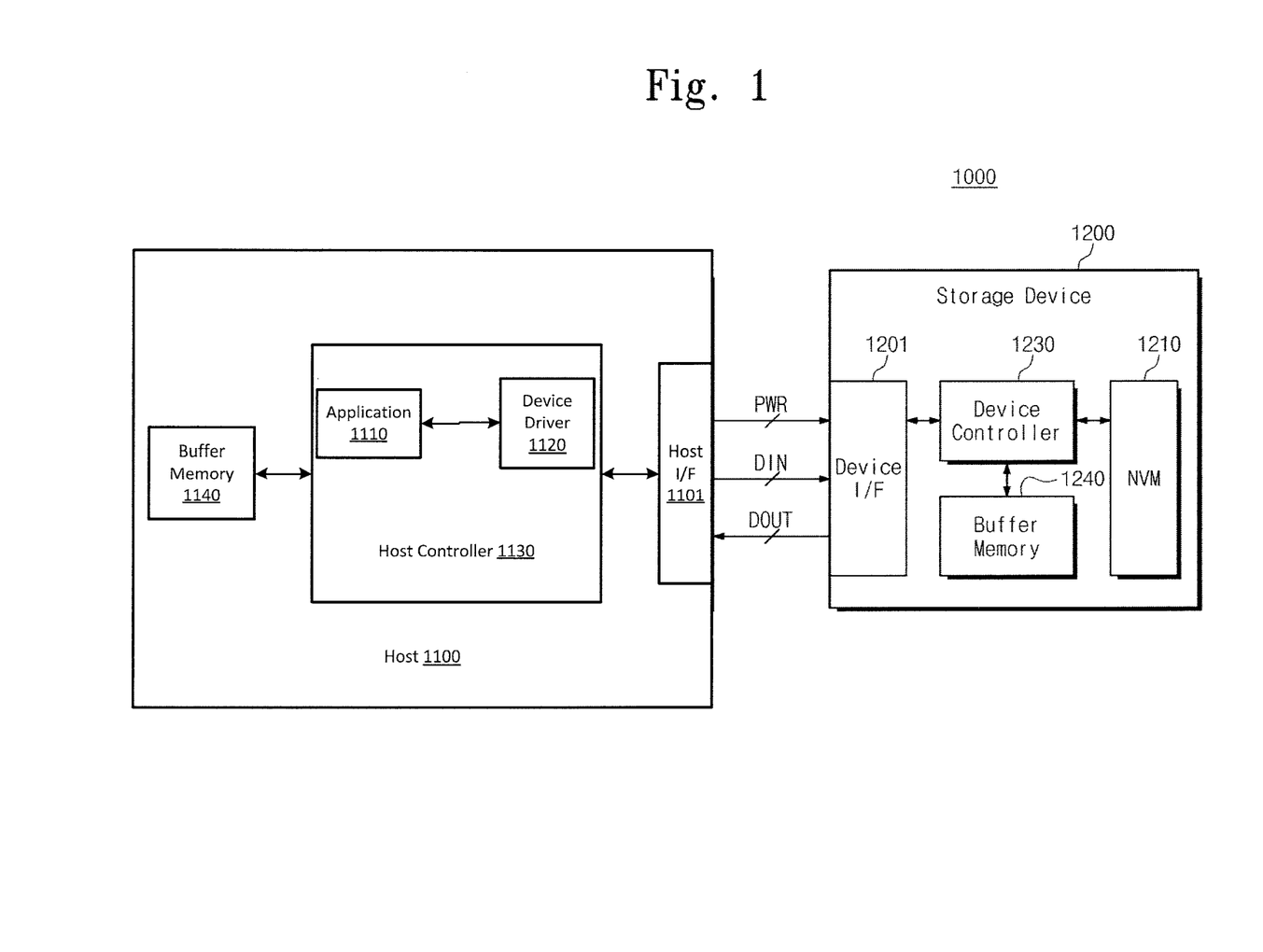
FIG. 1 is a block diagram schematically illustrating a storage system according to an example embodiment.

FIG. 1 is a block diagram schematically illustrating a storage system according to an example embodiment.

Referring to FIG. 1, the storage system 1000 includes a host 1100 and a storage device 1200.

The host 1100 includes a host interface 1101, and the storage device includes a device interface 1201. The storage device 1200 and the host 1100 are connected to one another through the interfaces 1101 and 1201. The host interface 1101 and the device interface 1201 may be standardized interfaces such as a UFS (Universal Flash Storage) interface, a SATA (serial advanced technology attachment (ATA)) interface, a SCSI (Small Computer Small Interface), a SAS (serial attached SCSI), etc. The host interface 1101 and the device interface 1201 are connected by data lines DIN and DOUT for exchanging data and/or signals, and by power lines PWR for providing power. In the example shown in FIG. 1, the host interface 1101 provides power to the device interface 1201 via the power line PWR.

Still referring to FIG. 1, the host 1100 further includes: a host controller 1130; and a buffer memory 1140. The host controller 1130 includes: an application 1110; and a device driver 1120;

According to at least some example embodiments, the application 1110 may refer to one or more application programs executed on the host 1100. The application 1110 and/or the device driver 1120 may be implemented by hardware, software and/or firmware. The host controller 1130 receives data from and sends commands (e.g., read, write, erase) and/ or data to the storage device 1200 through the host interface 1101.

According to at least some example embodiments, the buffer memory 1140 may be used as a main memory and/or a cache memory of the host 1100. The buffer memory 1140 (e.g., synchronous random access memory (SRAM) and/or dynamic random access memory (DRAM)) may also be used as a driving memory to drive software such as the application 1110 and/or the device driver 1120.

Still referring to FIG. 1, the storage device 1200 further includes: a nonvolatile memory 1210; a device controller (also referred to as a memory controller) 1230; and a buffer memory 1240. In this example, the storage device 1200 may be a data storage device based on a nonvolatile memory such as a flash memory or the like. For example, the nonvolatile memory 1210 may be a flash memory, a magnetic random access memory (MRAM), a phase change RAM (PRAM), a ferroelectric RAM (FeRAM), etc.

The device controller 1230 controls an overall operation of the nonvolatile memory 1210 including, for example, write operations, read operations, erase operations, encoding/decoding, error correction, etc. The device controller 1230 exchanges data with the nonvolatile memory 1210 and/or the buffer memory 1240 through an address and/or data bus. The device controller 1230 will be discussed in more detail later.

The buffer memory 1240 (e.g., synchronous random access memory (SRAM) and/or dynamic random access memory (DRAM)) temporarily stores data to be stored in the nonvolatile memory 1210 and/or data read from the nonvolatile memory 1210. The buffer memory 1240 may be implemented by a volatile and/or nonvolatile memory.

Figure 2:
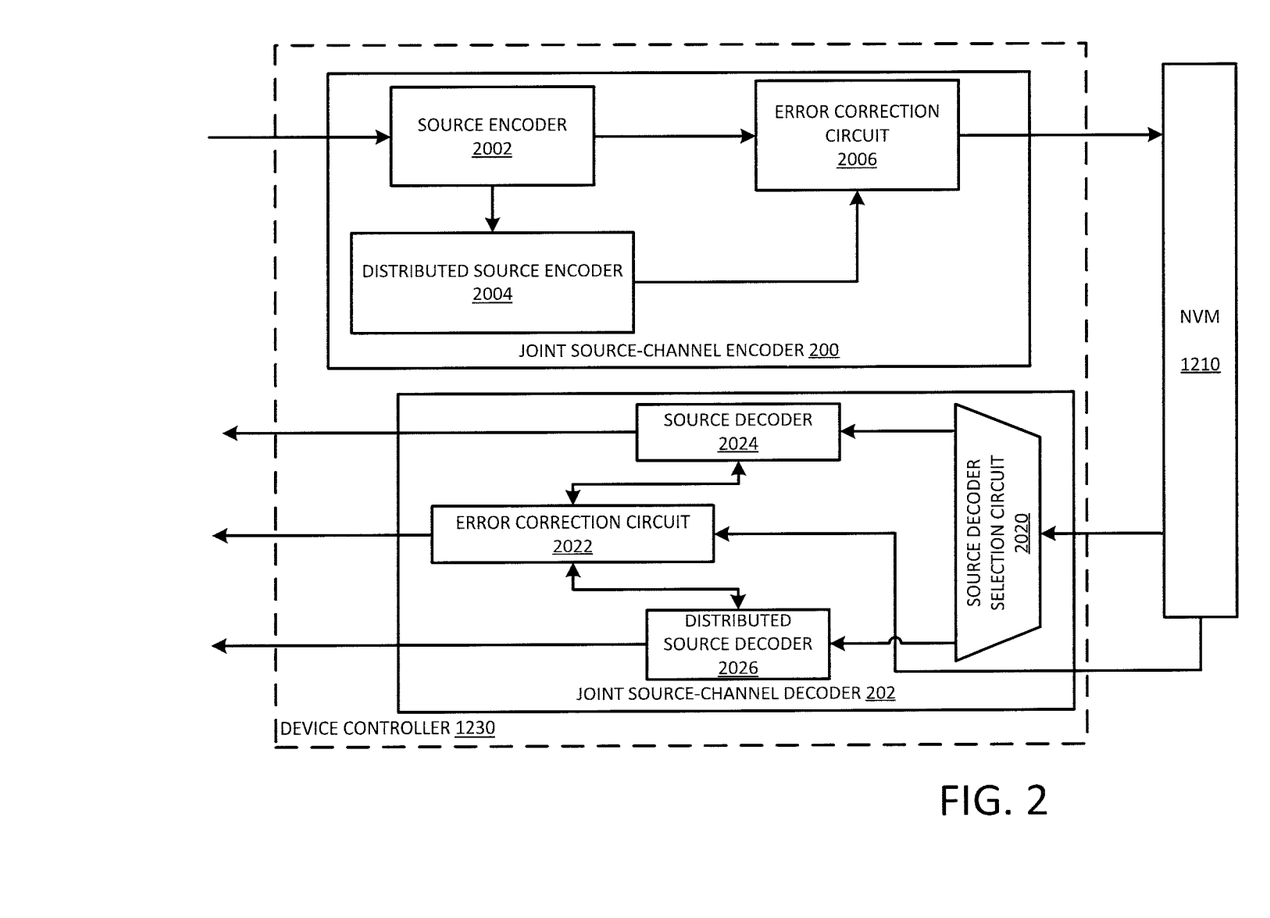
FIG. 2 is a block diagram illustrating an example embodiment of the device controller 1230 shown in FIG. 1.

FIG. 2 is a block diagram illustrating an example embodiment of the device controller 1230 shown in FIG. 1.

The device controller 1230 may be hardware, firmware, hardware executing software or any combination thereof. When the device controller 1230 is hardware, such hardware may include one or more Central Processing Units (CPUs), digital signal processors (DSPs), application-specific-integrated-circuits (ASICs), field programmable gate arrays (FPGAs) computers or the like configured as special purpose machines to perform the functions of the device controller 1230. CPUs, DSPs, ASICs and FPGAs may generally be referred to as processors and/or microprocessors.

In the event that the device controller 1230 is a processor executing software, the processor is configured as special purpose machine to execute the software to perform the functions of the device controller 1230. In such an embodiment, the device controller 1230 may include one or more Central Processing Units (CPUs), digital signal processors (DSPs), application-specific-integrated-circuits (ASICs), field programmable gate arrays (FPGAs) computers.

Referring to FIG. 2, the device controller 1230 includes a joint source-channel encoder (also referred to herein as a joint source-channel encoding circuit or joint source-channel encoder circuit) 200 and a joint source-channel decoder (also referred to herein as a joint source-channel decoding circuit or joint source-channel decoder circuit) 202.

Similar to the device controller 1230, the joint source-channel encoder 200 (including one or more components thereof) may be hardware, firmware, hardware executing software or any combination thereof. When the joint source-channel encoder 200 is hardware, such existing hardware may include one or more Central Processing Units (CPUs), digital signal processors (DSPs), application-specific-integrated-circuits (ASICs), field programmable gate arrays (FPGAs) computers or the like configured as special purpose machines to perform the functions of the joint source-channel encoder 200. CPUs, DSPs, ASICs and FPGAs may generally be referred to as processors and/or microprocessors.

In the event that the joint source-channel encoder 200 is a processor executing software, the processor is configured as special purpose machine to execute the software to perform the functions of the joint source-channel encoder 200. In such an embodiment, the joint source-channel encoder 200 may include one or more Central Processing Units (CPUs), digital signal processors (DSPs), application-specific-integrated-circuits (ASICs), field programmable gate arrays (FPGAs) computers.

The joint source-channel encoder 200 performs joint source-channel encoding on input data symbols (also referred to herein as an input data symbol sequence or input data) received from the host 1100 via the device interface 1201 and/or the buffer memory 1240. The joint source-channel encoder 200 outputs the encoded data to the nonvolatile memory 1210. The nonvolatile memory 1210 stores the encoded data from the joint source-channel encoder 200.

In more detail, according to at least one example embodiment, the joint source-channel encoder 200 source encodes the input data independent of whether the input data is compressible data, performs error correction coding on the source encoded data, and store the encoded data in the nonvolatile memory 1210.

In one example, a check or flag bit may be associated with, and/or stored in association with, the joint source-channel encoded data. In one example, the joint source-channel encoded data may include the check or flag bit (e.g., as the first bit of joint source-channel encoded data). In another example, the flag bit may be separate from, but stored in association with, the joint source-channel encoded data in the nonvolatile memory 1210. The flag bit indicates whether the joint source-channel encoded data is encoded using a regular joint source-channel coding algorithm or a distributed joint source-channel coding algorithm. The flag bit also indicates whether the encoded data is compressed data. The flag bit associated with the encoded data may be referred to as compression indicator information or source encoder indicator information. The flag bit will be discussed in more detail later.

Still referring to FIG. 2, the joint source-channel encoder 200 includes: a source encoder 2002; a distributed source encoder 2004; and an error correction circuit (also referred to as a channel coder or channel coding circuit) 2006. Example functionality of these components will be described in more detail below with regard to FIGS. 3 and 5.

Figure 3:
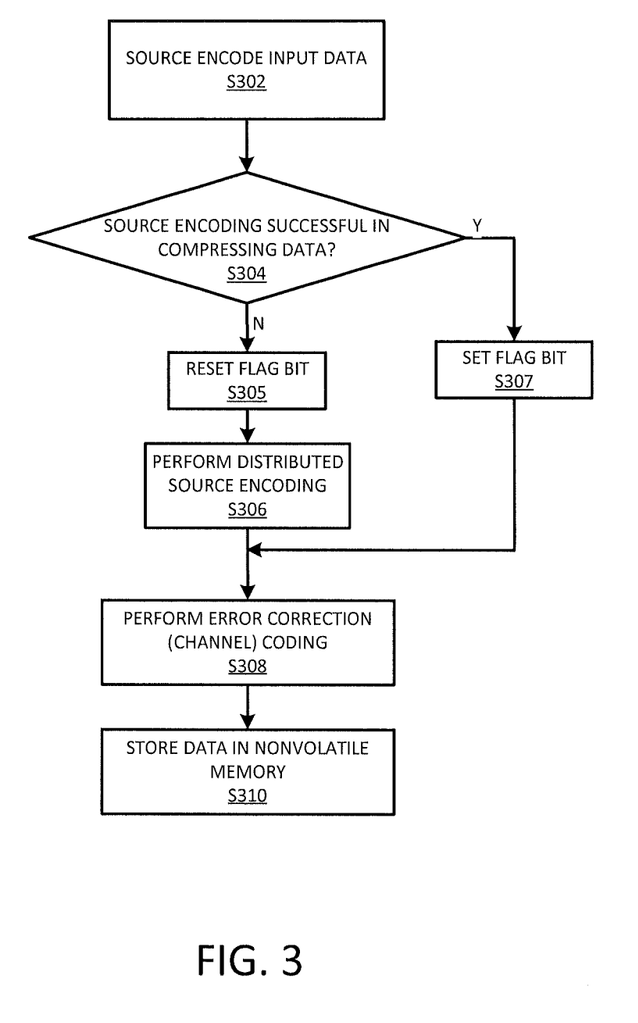
FIG. 3 is a flow chart illustrating an example embodiment of a method for encoding data.

FIG. 3 is a flow chart illustrating an example embodiment of a method for joint source-channel encoding of data. The method shown in FIG. 3 will be described with regard to the device controller 1230 shown in FIG. 2.

Referring to FIGS. 2 and 3, at S302 the source encoder 2002 source encodes the input data. The source encoder 2002 may source encode the input data using any suitable, known (regular or nonoverlapped) source encoding algorithms. In one example, the source encoder 2002 may source encode the input data using arithmetic encoding. Because source encoding algorithms such as this are well-known, a detailed discussion is omitted.

At S304, the device controller 1230 determines whether the source encoding was successful in compressing the input data. In one example, the device controller 1230 performs this determination by comparing the size of the encoded data with the original size of the input data. If the size of the encoded data is less than the original size of the input data, then the device controller 1230 determines that the source encoding of the input data was successful in compressing the input data. If the size of the encoded data is not less than (is greater than or equal to) the original size of the input data, then the device controller 1230 determines that the source encoding of the input data was not successful in compressing the input data. The device controller 1230 also determines that the input data is uncompressible data if the source encoding of the input data was not successful.

Returning to FIG. 3, if the device controller 1230 determines that the source encoding of the data was successful in compressing the input data, then the device controller 1230 sets the flag bit (e.g., as the first bit of the source encoded data) to a first value (e.g., '0' or '1') at S307. As discussed above, the flag bit indicates that the source encoding of the input data was successful in compressing the input data, and thus, the source encoded data is compressed data. The source encoder 2002 then outputs the encoded (compressed) data to the error correction circuit 2006.

At S308, the error correction circuit 2006 performs error correction (channel) coding on the source encoded data. As is known, error correction coding is a technique for controlling/correcting errors in data. In one example, the error correction circuit 2006 generates a codeword including the source encoded data and a set of parity bits using an error-correcting code (ECC). In one example, the error correction circuit 2006 may perform error correction coding on the source encoded data using Low-density parity-check (LDPC) coding. However, example embodiments should not be limited to only this example. Rather, example embodiments may utilize any suitable iterative ECC and/or error correction coding algorithm, such as, BCH error correcting coding or the like. For example purposes, example embodiments will be described with regard to the LDPC correction coding.

Still referring to FIG. 3, at S310 the device controller 1230 stores the generated codeword, including the source encoded data and the associated parity bits, in the nonvolatile memory 1210.

Returning to S304, if the device controller 1230 determines that the input data is uncompressible (if source encoding by the source encoder 2002 is unsuccessful in compressing the input data), then the device controller 1230 sets the flag bit to a second value (e.g., '0' or '1') at S305. According to example embodiments, the second value is different from the first value. The setting of the flag bit to the second value may also be referred to as "resetting" the flag bit. The source encoder 2002 then outputs the input data and the flag bit to the distributed source encoder 2004.

At S306, the distributed source encoder 2004 performs distributed (or overlapped) source encoding to source encode the input data. A simple example of distributed source arithmetic encoding by the distributed source encoder 2004 will be described below with regard to FIG. 5.

Figure 5:
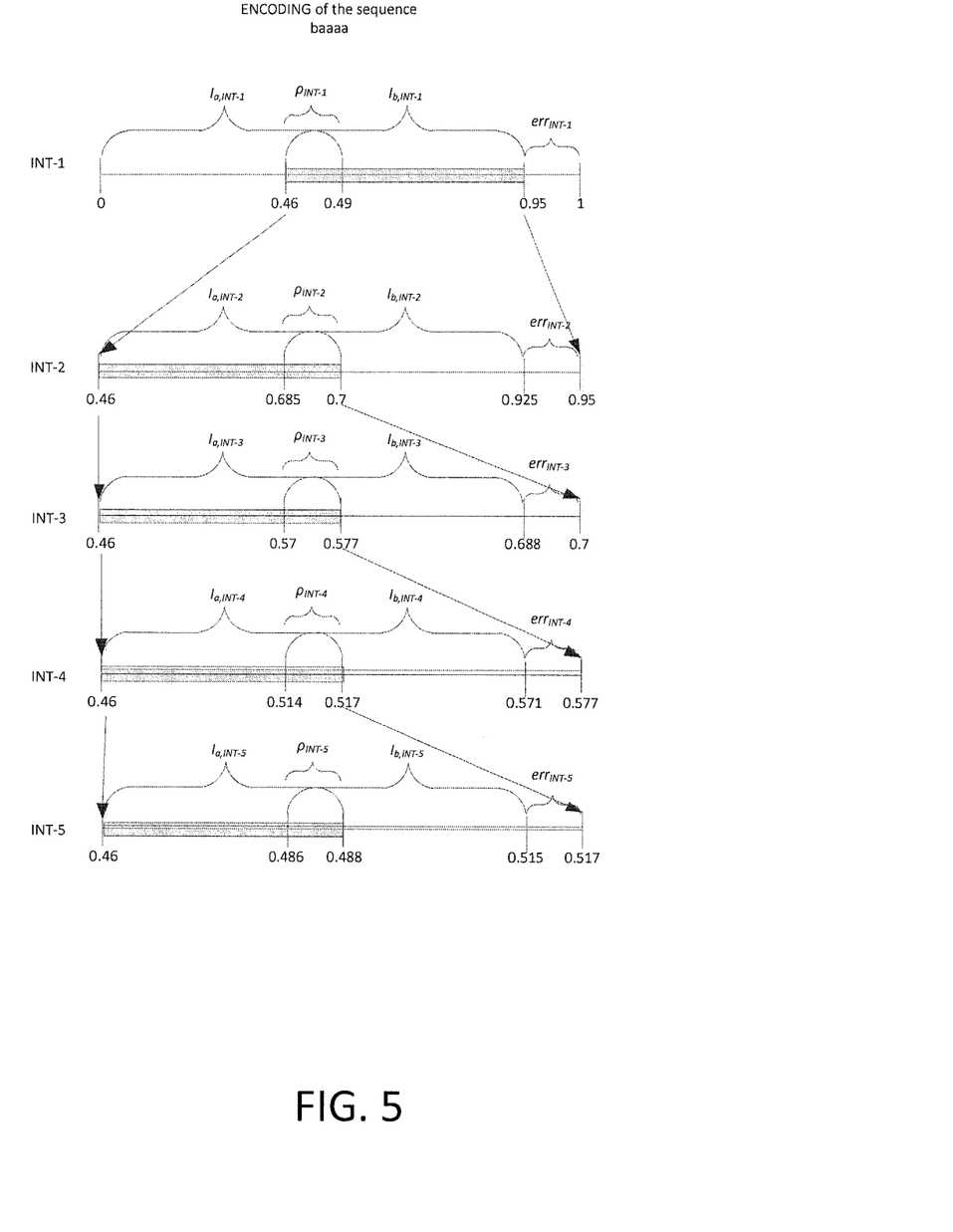
FIG. 5 illustrates an example distributed source encoding algorithm.

FIG. 5 illustrates a relatively simple example distributed source encoding algorithm.

Generally, in performing normal/regular (non-distributed) source encoding, an encoder considers three pieces of data when encoding an input data (or symbol sequence): (i) the next symbol in the sequence to be encoded; (ii) the current interval; and (iii) probabilities assigned to each of the symbols in the alphabet of symbols. The encoder divides the current interval into sub-intervals, each representing a fraction of the current interval proportional to the probability of that symbol in the current context. The subinterval corresponding to the symbol to be encoded becomes the current interval used in the next step of the encoding process.

In the case of overlapped or distributed arithmetic encoding, the current interval is first divided as discussed above, and then the subintervals are modified such that the subintervals overlap. The overlapping parameter $\rho$ controls the width of overlap between the subintervals. The overlapping of the subintervals in distributed source encoding allows wider subintervals, which allows for higher compression of the data.

According to example embodiments, the top or uppermost portion of each interval is designated as an error interval err. The error interval err represents a symbol or bit stream that is not part of the input data or symbol sequence. The error interval err is used to detect and correct errors encountered during distributed source decoding at the decoder, as will be discussed in more detail later with regard to FIGS. 4 and 6.

According to at least some example embodiments, for the binary case, the probabilities of the symbols in the alphabet of symbols are designated values as close as possible to 0.5, and the error interval err is chosen to be greater than the overlap interval designated by the overlapping parameter $\rho$ (i.e., err>$\rho$).

The example shown in FIG. 5 utilizes a floating point encoding algorithm to encode a symbol sequence 'baaaa' into a decimal, such as 0.462. The alphabet of the source A={a, b}. As discussed with regard to FIG. 5, the probability of symbol 'a' is denoted $P_a$ and the probability of symbol 'b' is denoted $P_b$. The probability of each of the symbols 'a' and 'b' is 0.49 (i.e., $P_a=P_b=0.49$), the overlapping parameter $\rho$ is 0.03, and the error interval err is 0.05.

The subinterval corresponding to the probability $P_a$ is denoted $I_{a,INT-n}$, the subinterval corresponding to the probability $P_b$ is denoted $I_{b,INT-n}$, the error interval is denoted $err_{INT-n}$, and the overlapped interval is denoted $\rho_{INT-n}$. As mentioned above, $err_{INT-n} > \rho_{INT-n}$. In this example, n is 1, 2, 3, ..., N, and N is the number of symbols in the input data or symbol sequence. For the example symbol sequence 'baaaa' mentioned above, N is 5.

Referring to FIG. 5, the first current interval INT-1 is [0,1). In the context of first current interval INT-1, the subinterval $I_{a,INT-1}$ is [0,0.49) and has a length 0.49. The subinterval $I_{b,INT-1}$ is [0.46,0.95) and has a length 0.49. The overlapped interval $\rho$ is [0.46,0.49) and has a length 0.03, and the error interval err is [0.95,1.0) and has a length 0.05.

According to at least some example embodiments, the subintervals $I_a$ and $I_b$ are selected to be as close as possible to 0.5 to produce minimal expansion during encoding. The larger the overlapping interval $\rho$, the more likely a bit will fall within the interval, which increases the complexity at the decoder side. Accordingly, subinterval sizes $I_a$ and $I_b$ are chosen to be less than, but as close as possible to 0.5. The subinterval sizes (or coding model) may be defined in any well-known manner, but taking into account the additional parameters for defining the model discussed above.

Since the first symbol in the input symbol sequence 'baaaa' is 'b', the subinterval $I_{b,INT-1}$ [0.46,0.95) is used as the second current interval INT-2 for encoding the second symbol 'a'. The distributed source encoder 2004 divides the second current interval INT-2 [0.46,0.95) into subintervals as shown in FIG. 5, each representing a fraction of the second current interval INT-2, where the fraction is proportional to the size of the corresponding subinterval in the previous context.

For example, in the context of the second current interval INT-2, the subinterval $I_{a,INT-2}$ is [0.46,7) and has a length of 0.24, which is 49% of the second current interval INT-2 [0.46,0.95). The subinterval $I_{b,INT-2}$ is [0.685,0.925), and has a length of 0.24, which is 49% of the second current interval INT-2. The overlapped interval $\rho$INT-2 is [0.685,0.7) and has a length of 0.015, which is 3% of the second current interval INT-2. The error interval $err_{INT-2}$ is [0.925,0.95) and has a length of 0.025, which is 5% of the second current interval INT-2.

Since the second symbol in the symbol sequence is 'a', the subinterval $I_{a,INT-2}$ is used as the third current interval INT-3 for encoding the third symbol 'a' in the symbol sequence 'baaaa'.

In the context of the third current interval INT-3, the subinterval $I_{a,INT-3}$ is [0.46,0.577). The subinterval $I_{b,INT-3}$ is [0.57,0.688). The overlapped interval $\rho$INT-3 is [0.57,0.577). The error interval $err_{INT-3}$ is [0.688,0.7).

Since the third symbol in the sequence is a, the subinterval $I_{a,INT-3}$ is used as the fourth current interval INT-4 for encoding the fourth symbol 'a' in the symbol sequence 'baaaa'.

In the context of the fourth current interval INT-4, the subinterval $I_{a,INT-4}$ is [0.46,0.517), the subinterval $I_{b,INT-4}$ is [0.514,0.571), the overlapped interval $\rho_{INT-4}$ is [0.514,0.517), and the error interval $err_{INT-4}$ is [0.571,0.577).

Since the fourth symbol in the sequence is 'a', the subinterval $I_{a,INT-4}$ is used as the fifth current interval INT-5 for encoding the fifth and final symbol 'a' in the symbol sequence 'baaaa'.

In the context of the fifth current interval INT-5, the subinterval $I_{a,INT-5}$ is [0.46,0.488), the subinterval $I_{b,INT-5}$ is [0.486,0.515), the overlapped interval $\rho_{INT-5}$ is [0.486,0.488), and the error interval $err_{INT-5}$ is [0.515,0.517).

Since the final symbol in the symbol sequence 'baaaa' is 'a', the symbol sequence is encoded as a fraction or decimal value in the final interval $I_{a,INT-5}$=[0.46,0.488), such as 0.462. Although discussed above with regard to a floating point arithmetic coder for the sake of simplicity of describing the encoding algorithm, example embodiments may utilize integer arithmetic encoding in the same or substantially the same manner. Example embodiments may also be implemented using a deterministic distributed source encoding algorithm.

Returning to FIG. 3, the distributed source encoder 2004 outputs the encoded data to the error correction circuit 2006.

At S308, the error correction circuit 2006 performs error correction coding on the distributed source encoded data in the same manner as discussed above.

At S310, the device controller 1230 stores the codeword, including the encoded data and the associated parity bits, in the nonvolatile memory 1210 as discussed above.

Referring back to FIG. 2, as mentioned above, the device controller 1230 also includes the joint source-channel decoder 202.

The joint source-channel decoder 202 (including one or more components thereof) may be hardware, firmware, hardware executing software or any combination thereof. When the joint source-channel decoder 202 is hardware, such existing hardware may include one or more Central Processing Units (CPUs), digital signal processors (DSPs), application-specific-integrated-circuits (ASICs), field programmable gate arrays (FPGAs) computers or the like configured as special purpose machines to perform the functions of the joint source-channel decoder 202. CPUs, DSPs, ASICs and FPGAs may generally be referred to as processors and/or microprocessors.

In the event that the joint source-channel decoder 202 is a processor executing software, the processor is configured as special purpose machine to execute the software to perform the functions of the joint source-channel decoder 202. In such an embodiment, the joint source-channel decoder 202 may include one or more Central Processing Units (CPUs), digital signal processors (DSPs), application-specific-integrated-circuits (ASICs), field programmable gate arrays (FPGAs) computers.

As shown in FIG. 2, the joint source-channel decoder 202 includes: a source decoder selection circuit 2020; a source decoder 2024; a distributed source decoder 2026; and an error correction circuit 2022. Example functionality of the joint source-channel decoder 202 and its components will now be described in more detail with regard to FIGS. 4 and 6.

According to at least one example embodiment, the joint source-channel decoder 202 reads data from the nonvolatile memory 1210, and performs source decoding of the read data between iterations of error correction coding of the read data. The source decoding of the read data is performed independent of whether the read data is compressed or uncompressed data. The joint source-channel decoder 202 then outputs output the read data to at least one of the buffer memory 1240 and the device interface 1201.

Figure 4:
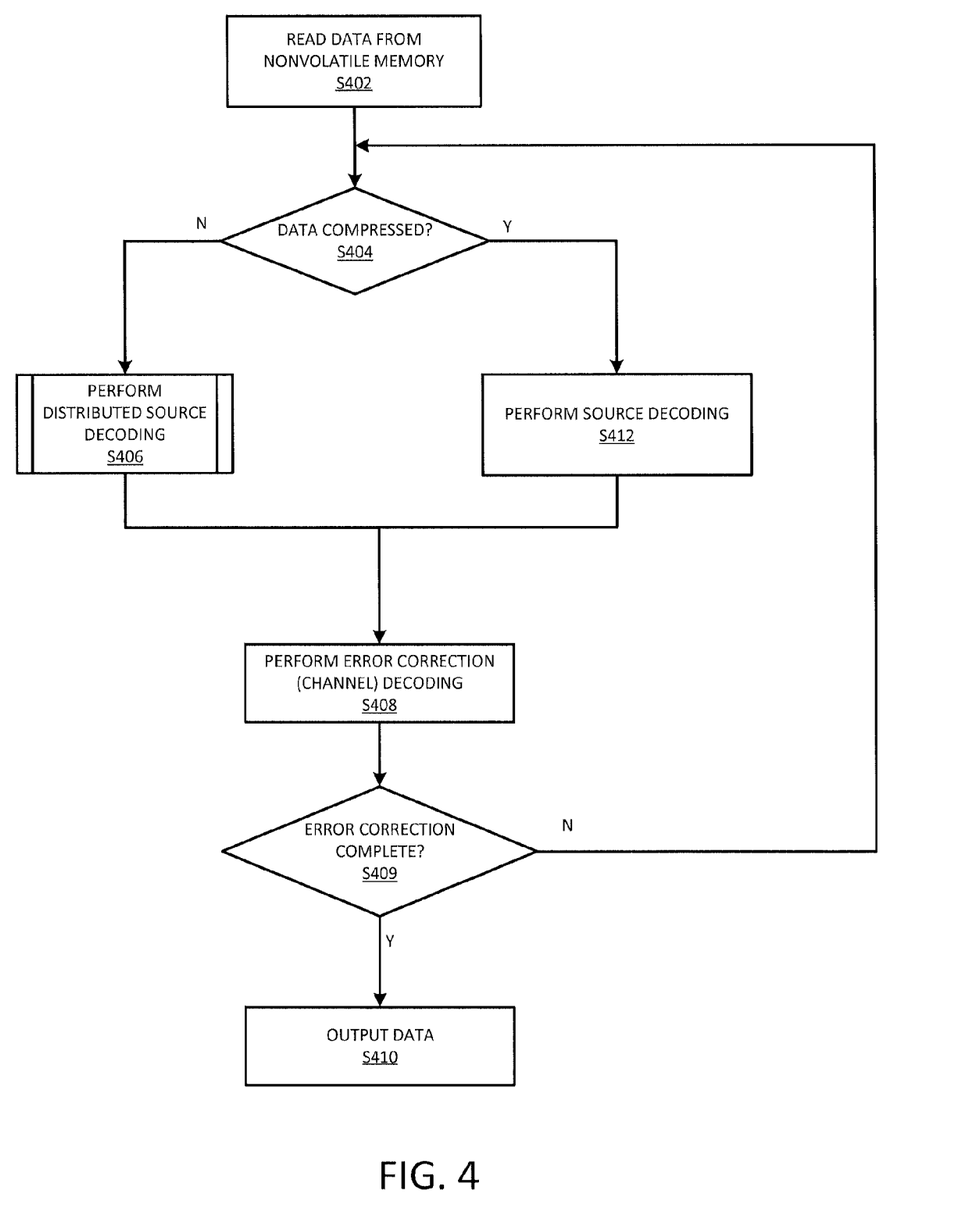
FIG. 4 is a flow chart illustrating an example embodiment of a method for decoding data.

FIG. 4 is a flow chart illustrating an example embodiment of a method for decoding data read from the nonvolatile memory 1210.

In the method shown in FIG. 4, the joint source-channel decoder 202 performs an iterative process between the source decoding and the error correction.

According to at least some example embodiments, an iteration of source decoding (either regular/nonoverlapped or distributed/overlapped) is inserted between each iteration of error correction coding to increase the reliability of the bits of data read from the nonvolatile memory.

The method shown in FIG. 4 will be described with regard to the joint source-channel decoder 202 shown in FIG. 2. And, for example purposes, the method shown in FIG. 4 will also be described with regard to the LDPC correction coding (also sometimes referred to herein as LDPC error correction or LDPC coding) performed at the error correction circuit 2022. As is known, LDPC correction coding is an iterative error correction algorithm in which each bit is assigned a log likelihood ratio (LLR) describing the reliability of the bit. During each iteration of the LDPC correction coding algorithm, more and more bits become reliable until the process is finished using a simple cyclic-redundancy-check (CRC) verification code.

According to the example embodiment shown in FIG. 4, an iteration of source decoding (either regular/nonoverlapped or distributed/overlapped) is inserted between each iteration of the LDPC correction coding algorithm to increase the reliability of the bits of data read from the nonvolatile memory 1210.

In more detail, example embodiments utilize the source decoding between each iteration of the LDPC correction coding algorithm to increase reliability of bits based on the fact that arithmetic coding does not produce errors, but is able to determine whether an error exists, as discussed in more detail below. In one example, if none of a first 1000 bits of read data fall into an error interval during the source decoding, then the device controller 1230 may determine with relative certainty that the first 500 bits of data read from the nonvolatile memory 1210 are reliable. However, if bits within the first 1000 bits fall within the error interval during the source decoding, then the previous 500 bits may not be as reliable. By inserting the source decoding between each iteration of the LDPC correction coding process, the reliability of the read data may be improved.

Referring to FIGS. 2 and 4, at S402 the source decoder selection circuit 2020 reads out stored data from the nonvolatile memory 1210 (e.g., in response to a read command from the host 1100).

At S404, the source decoder selection circuit 2020 determines whether the read data is compressed data based on the compression (or source encoding) indicator information associated with the read data. In one example, the source decoder selection circuit 2020 determines whether the read data is compressed data based on the flag bit associated with the read data. As discussed above, if the flag bit is set (e.g., to a first value, such as '1'), then the source decoder selection circuit 2020 determines that the read data is compressed data. Otherwise, if the flag bit is reset (e.g., to a second value, such as '0'), then the source decoder selection circuit 2020 determines that the read data is uncompressed data.

The source decoder selection circuit 2020 outputs the read data to one of the source decoder 2024 and the distributed source decoder 2026 based on whether the data is compressed data.

Referring still to FIG. 4, if the source decoder selection circuit 2020 determines that the read data is uncompressed data at S404, then the source decoder selection circuit 2020 outputs the read data to the distributed source decoder 2026.

At S406, the distributed source decoder 2026 performs distributed source decoding on the read data from the source decoder selection circuit 2020. An example distributed source decoding algorithm will be discussed in more detail below with regard to FIG. 6.

Figure 6:
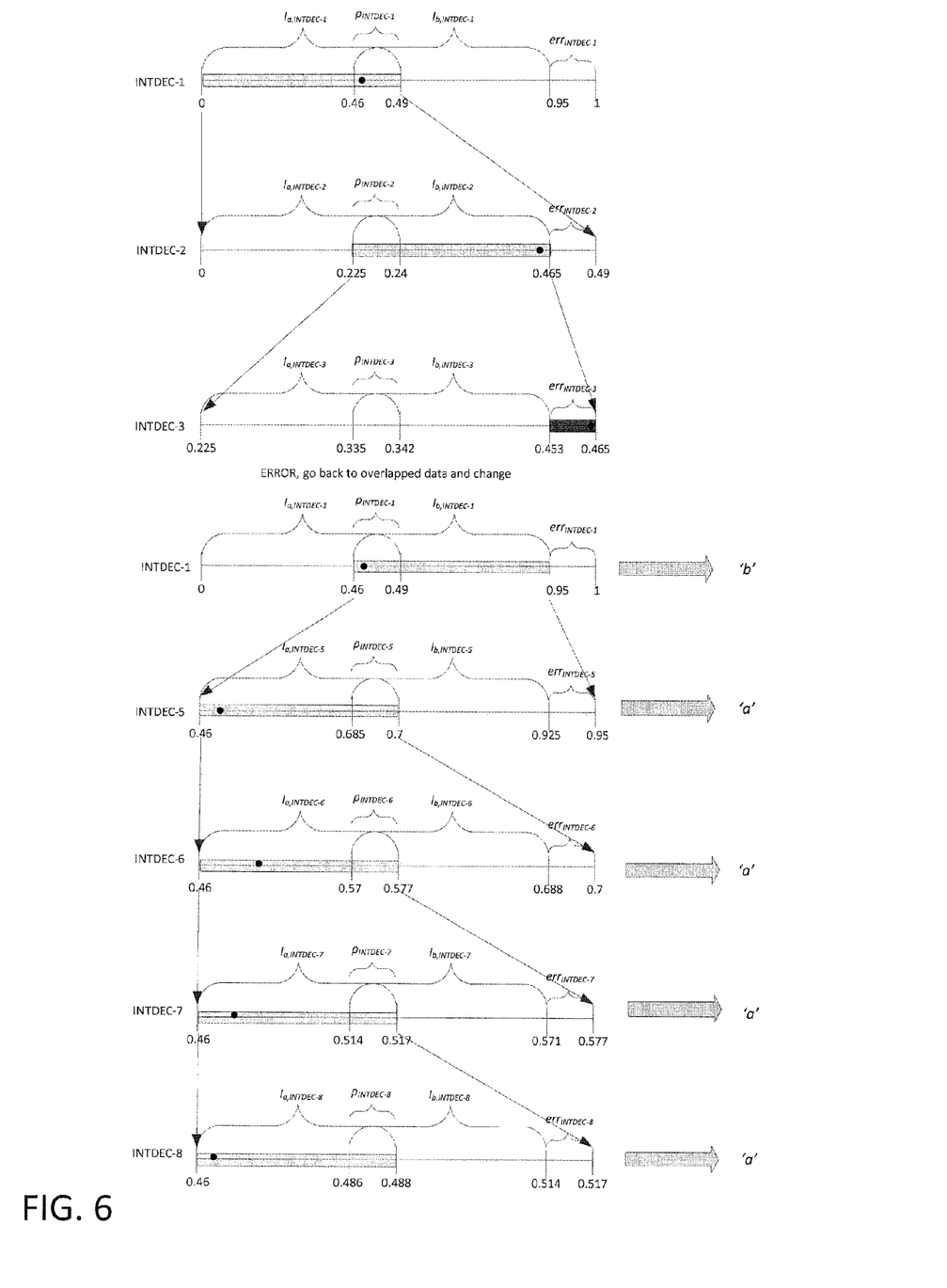
FIG. 6 illustrates an example distributed source decoding algorithm.

FIG. 6 illustrates an example distributed source decoding algorithm for decoding the data encoded as decimal 0.462 in accordance with the algorithm shown in FIG. 5.

Referring to FIG. 6, the process begins with the same initial current interval [0,1), denoted as INTDEC-1 in FIG. 6. As with the interval INT-1 in FIG. 5, subinterval $I_{a,INTDEC-1}$ corresponding to probability $P_a$ is [0,0.49), subinterval $I_{b,INTDEC-1}$ corresponding to probability $P_b$ is [0.46,0.95), the overlapped interval $\rho_{INTDEC-1}$ is [0.46,0.49), and the error interval $err_{INTDEC-1}$ is [0.95,1.0).

The distributed source decoder 2026 decodes each symbol in the symbol sequence based on the location of the decimal 0.462 within the context of a current interval. The subinterval in which the fraction or decimal is located is then used as the interval for decoding the next symbol in the sequence. The current interval is divided into subintervals in the same manner as discussed above with regard to FIG. 5.

For example, if the value 0.462 falls within the subinterval $I_{a,INTDEC-n}$, then the distributed source decoder 2026 decides that the n-th symbol is a. If the value 0.462 falls within the interval $I_{b,INTDEC-n}$, then the distributed source decoder 2026 decides that the n-th symbol is b. If the value 0.462 falls within the overlapped interval $\rho_{INTDEC-n}$, then the distributed source decoder 2026 is unsure of the actual symbol value. In this case, the distributed source decoder 2026 marks this symbol as a suspicious bit or symbol, guesses that the n-th symbol is 'a', and continues to the next symbol.

If the value 0.462 falls within the error interval $err_{INTDEC-n}$, then the distributed source decoder 2026 detects an error in the source decoding. More specifically, the distributed source decoder 2026 determines that the guessed value of the most recent suspicious bit (or symbol) is incorrect. The decoder 2026 then retraces to the most recent suspicious bit, changes the value of the suspicious bit, and repeats the decoding process going forward.

Still referring to FIG. 6, in the first current interval INTDEC-1, the decimal 0.462 falls into the overlapped interval $\rho_{INTDEC-1}$ [0.46, 0.49), which indicates that the first symbol in the symbol sequence could be 'a' or 'b'. In this example, the distributed source decoder 2026 guesses symbol 'a', marks this symbol as a suspicious bit, and uses the subinterval $I_{a,INTDEC-1}$ [0,0.49) as the next current interval INTDEC-2.

In the second current interval INTDEC-2, subinterval $I_{a,INTDEC-2}$ is [0,0.24), subinterval $I_{b,INTDEC-2}$ is [0.225,0.465), the overlapped interval $\rho_{INTDEC-2}$ is [0.225, 0.24), and the error interval $err_{INTDEC-2}$ is [0.465,0.49).

In the context of the current interval INTDEC-2, the decimal 0.462 falls into the interval $I_{b,INTDEC-2}$, which indicates that the second symbol in the symbol sequence is 'b', and the subinterval $I_{b,INTDEC-2}$ [0.225,0.465) is used as the current interval.

In the third current interval INTDEC-3, subinterval $I_{a,INTDEC-3}$ is [0.225,0.342), subinterval $I_{b,INTDEC-3}$ is [0.335, 0.453), the overlapped interval $\rho_{INTDEC-3}$ is [0.335,0.342), and the error interval $err_{INTDEC-3}$ is [0.453,0.465).

In the context of the third current interval INTDEC-3, the decimal 0.462 falls into the error interval $err_{INTDEC-3}$, which indicates a source coding error.

In response to detecting the source coding error, as discussed above, the distributed source decoder 2026 returns to the most recent suspicious bit, changes the symbol value and then repeats the decoding algorithm.

In the example shown in FIG. 6, the distributed source decoder 2026 returns to the first symbol in the sequence, and changes the symbol value from 'a' to 'b'. In this iteration, the subinterval $I_{b,INTDEC-1}$ is used as the current interval INTDEC-5 for decoding the second symbol in the symbol sequence.

In the second current interval INTDEC-5, subinterval $I_{a,INTDEC-5}$ is [0.46,0.7), subinterval $I_{b,INTDEC-5}$ is [0.685,0.925), the overlapped interval $\rho_{INTDEC-5}$ is [0.685, 0.7), and the error interval $err_{INTDEC-5}$ is [0.925,0.95).

In the context of second current interval INTDEC-5, the decimal 0.462 falls into the subinterval $I_{a,INTDEC-5}$ indicating that the second symbol in the symbol sequence is 'a'. The subinterval $I_{a,INTDEC-5}$ [0.46,0.7) is then used as the third current interval INTDEC-6 for decoding the third symbol in the sequence.

In the third current interval INTDEC-6, subinterval $I_{a,INTDEC-6}$ is [0.46,0.577), subinterval $I_{b,INTDEC-6}$ is [0.57, 0.688), the overlapped interval $\rho_{INTDEC-6}$ is [0.57,0.577), and the error interval $err_{INTDEC-6}$ is [0.688,0.7).

In the context of third current interval INTDEC-6, the decimal 0.462 falls into the subinterval $I_{a,INTDEC-6}$ indicating that the third symbol in the sequence is 'a'. The subinterval $I_{a,INTDEC-6}$ [0.46,0.577) is then used as the fourth current interval INTDEC-7 for decoding the fourth symbol in the sequence.

In the fourth current interval INTDEC-7, subinterval $I_{a,INTDEC-7}$ is [0.46,0.517), subinterval $I_{b,INTDEC-7}$ is [0.514, 0.571), the overlapped interval $\rho_{INTDEC-7}$ is [0.514,0.517), and the error interval $err_{INTDEC-7}$ is [0.571,0.577).

In the context of fourth current interval INTDEC-7, the decimal 0.462 falls into the subinterval $I_{a,INTDEC-7}$ indicating that the fourth symbol in the symbol sequence is 'a'. The subinterval $I_{a,INTDEC-7}$ [0.46,0.517) is then used as the fifth and final interval INTDEC-8 for decoding the final symbol in the sequence.

In the final interval INTDEC-8, subinterval $I_{a,INTDEC-8}$ is [0.46,0.488), subinterval $I_{b,INTDEC-8}$ is [0.486,0.514), the overlapped interval $\rho_{INTDEC-8}$ is [0.486,0.488), and the error interval $err_{INTDEC-8}$ is [0.514,0.517).

In the context of final interval INTDEC-8, the decimal 0.462 falls into the subinterval $I_{a,INTDEC-8}$ indicating that the final symbol in the symbol sequence is 'a', and that the resultant decoded symbol sequence is 'baaaa'.

In at least one example embodiment, the distributed source decoder 2026 determines that the decoding process is complete based on a termination sequence, which is well-known, and thus, not described in detail. In another example, the distributed source decoder 2026 determines that the decoding process is complete by counting the number of bits decoded since the distributed source decoder 2026 has knowledge of the number of encoded symbols in the read data. When the number of encoded symbols has been decoded, then the distributed source decoder 2026 determines that the decoding process for the read data is complete.

Returning to FIG. 4, after performing the distributed source decoding of the read data the source decoded data is output to the error correction circuit 2022, and the process proceeds to S408.

At S408, the error correction circuit 2022 performs an iteration of the LDPC correction coding algorithm on the decoded data. Because the LDPC correction coding algorithm are well-known a detailed discussion is omitted.

At S409, after the iteration of the LDPC correction coding algorithm is complete, the error correction circuit 2022 determines whether the LDPC process is complete. In one example, the error correction circuit 2022 determines that the LDPC process is complete if no further errors are detected, or if all error bits have been recovered.

If the error correction circuit 2022 determines that the LDPC process is not complete (i.e., further iterations of the LDPC process are necessary) at S409, then the process returns to S404 and another iteration of the decoding process is performed as discussed above.

Returning to S409, if the error correction circuit 2022 determines that the LDPC process is complete (i.e., no further iterations are necessary), then the error correction circuit 2022 outputs the error corrected data to at least one of the device interface 1201 and the buffer memory 1240 at S410.

Returning now to S404 in FIG. 4, if the source decoder selection circuit 2020 determines that the read data from the source decoder selection circuit 2020 is compressed data, then the source decoder selection circuit 2020 outputs the read data to the source decoder 2024.

At S412, the source decoder 2024 performs source decoding on the read data from the source decoder selection circuit 2020. The source decoder 2024 decodes the read data using a source decoding algorithm corresponding to the source encoding algorithm used at the distributed source encoder 2004. Because source decoding algorithms, such as arithmetic decoding, are well-known, a detailed discussion is omitted. The decoded data is then output to the error correction circuit 2022, and the process proceeds to S408. The process then continues as discussed above until the data is output at S410.

Figure 7:
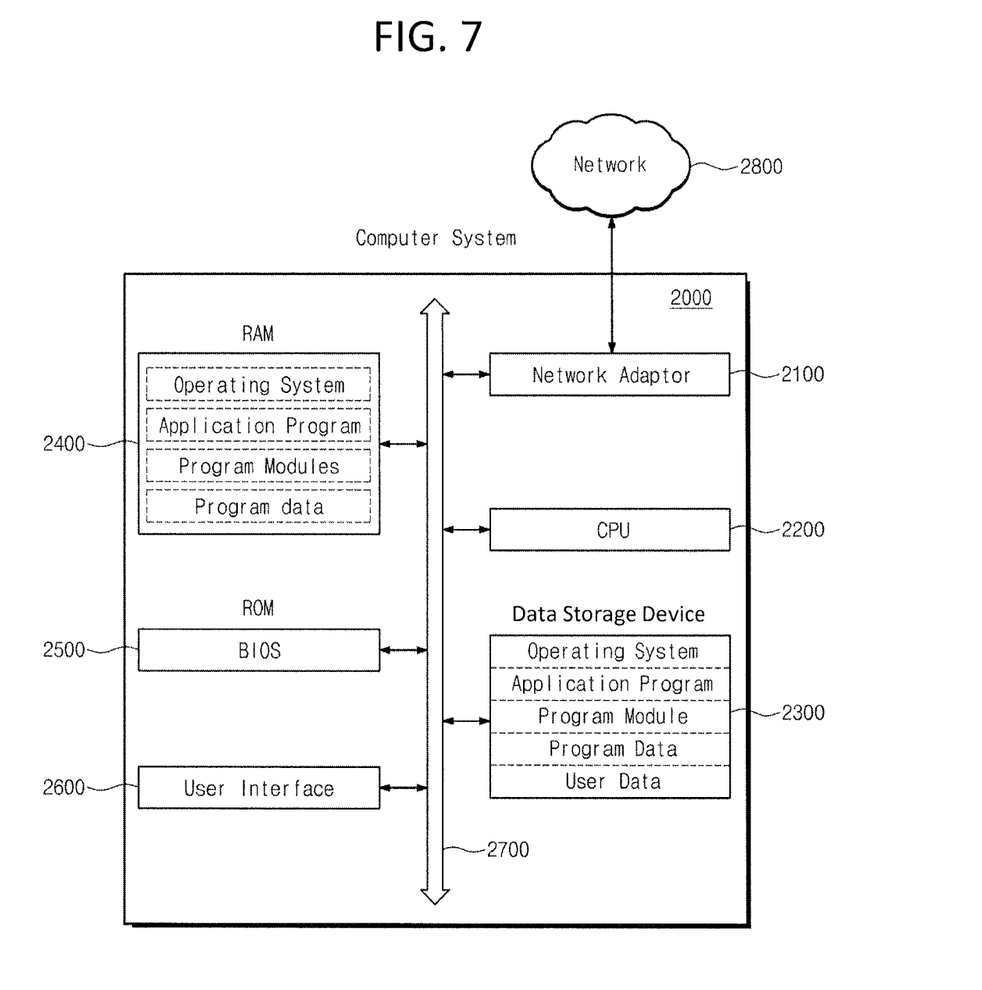
FIG. 7 is a block diagram schematically illustrating a computing system according to an example embodiment.

FIG. 7 is a block diagram schematically illustrating a computing system according to an example embodiment.

Referring to FIG. 7, a computing system 2000 includes: a network adaptor 2100; a central processing unit (CPU) 2200; a data storage device 2300; a RAM 2400; a ROM 2500; and a user interface 2600, which are connected with a system bus 2700.

The network adaptor 2100 provides an interface between the computing system 2000 and external networks 2800. The CPU 2200 controls an overall operation for driving an operating system and an application program which are resident on the RAM 2400. The data storage device 2300 stores data needed for the computing system 2000. For example, the data storage device 2300 may store an operating system for driving the computing system 2000, an application program, various program modules, program data, user data, and so on.

The RAM 2400 is used as a working memory of the computing system 2000. Upon booting, the operating system, the application program, the various program modules, and program data needed to drive programs and various program modules read out from the data storage device 2300 may be loaded into the RAM 2400. The ROM 2500 stores a basic input/output system (BIOS), which is activated before the operating system is driven upon booting. Information exchange between the computing system 3000 and a user may be made via the user interface 2600.

In addition, the computing system 2000 may further include a battery, a modem, and the like. Although not shown, the computing system 2000 may further include an application chipset, a camera image processor (CIS), a mobile DRAM, and the like.

The data storage device 2300 may include the nonvolatile storage device 1200 shown in FIG. 1. The data storage device 2300 may be implemented by a solid state drive, a multimedia card (MMC), a secure digital (SD) card, a micro SD card, a memory stick, an ID card, a PCMCIA card, a chip card, an USB card, a smart card, a compact flash (CF) card, and so on.

Figure 8:
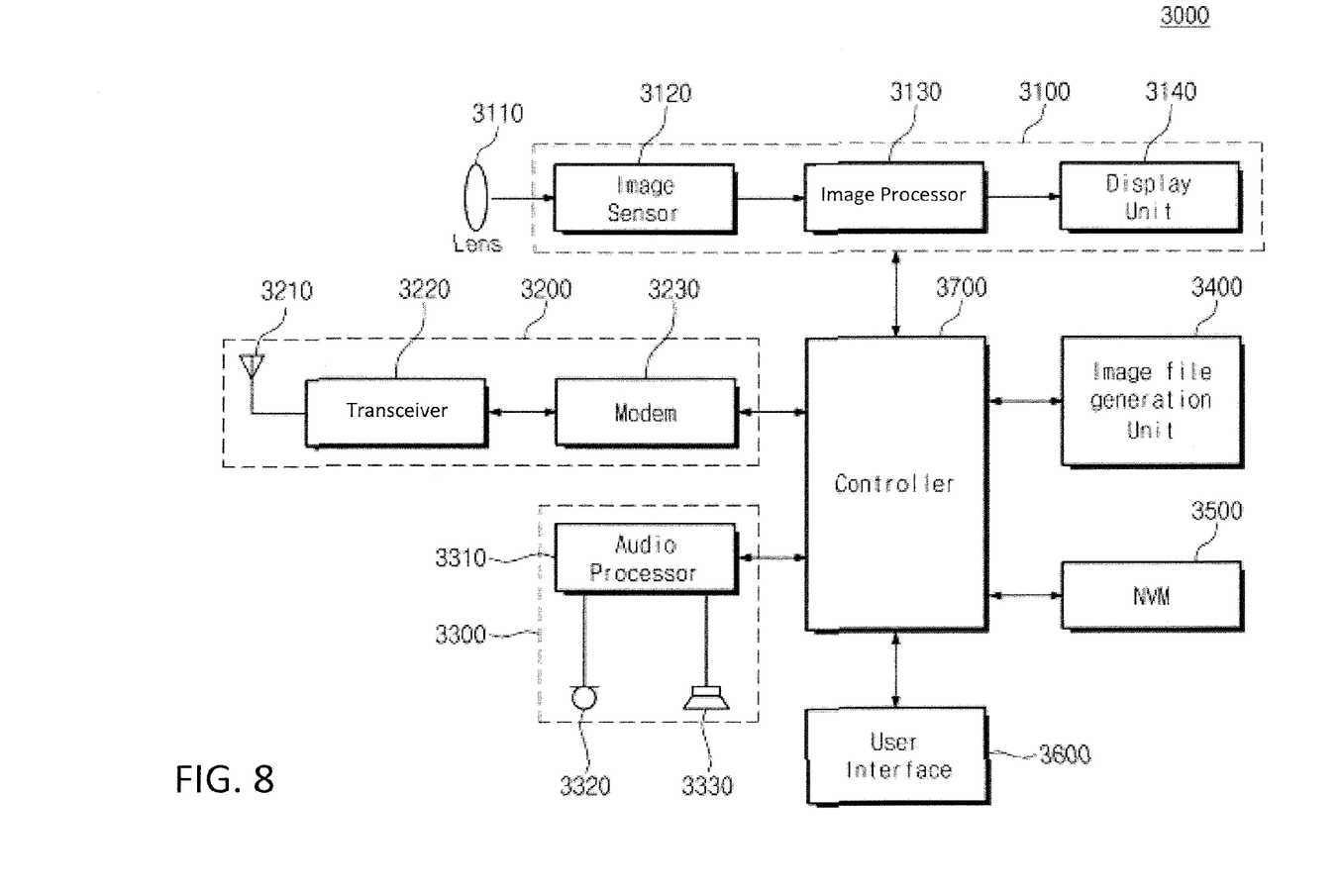
FIG. 8 is a block diagram schematically illustrating a handheld terminal according to an example embodiment.

FIG. 8 is a block diagram schematically illustrating a handheld terminal according to an example embodiment.

Referring to FIG. 8, the handheld terminal 3000 includes: an image processing circuit 3100; a wireless transceiver circuit 3200; an audio processing circuit 3300; an image file generating circuit 3400; a nonvolatile memory device 3500; a user interface 3600; and a controller 3700.

The image processing circuit 3100 includes: a lens 3110; an image sensor 3120; an image processor 3130; and a display unit 3140. The wireless transceiver circuit 3200 includes: an antenna 3210; a transceiver 3220; and a modem 3230. The audio processing circuit 3300 includes: an audio processor 3310; a microphone 3320; and a speaker 3330.

In this example embodiment, the nonvolatile memory device 3500 may be or include the nonvolatile storage device 1200 shown in FIG. 1 and may be implemented by at least one of a memory system, a memory card, an SSD, and an eMMC driven according to one or more example embodiments of inventive concepts discussed herein.

Devices according to example embodiments may be packed by according to various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The foregoing description of example embodiments has been provided for purposes of illustration and description. It is not intended to be exhaustive or limiting. Individual elements or features of a particular example embodiment are generally not limited to that particular example embodiment. Rather, where applicable, individual elements or features are interchangeable and may be used in a selected embodiment, even if not specifically shown or described. The same may also be varied in many ways. All such modifications are intended to be included within the scope of this disclosure.

What is claimed is:

1. A memory controller comprising:
    a joint source-channel encoder circuit configured to
        generate source encoded data by source encoding received data independent of whether the received data is compressible data, the source encoding the received data including
            determining whether the received data is uncompressible data, and
            encoding the received data according to a distributed source encoding algorithm if the received data is uncompressible data;
        perform error correction coding on the source encoded data; and
        store the source encoded data in a memory device.

2. The memory controller of claim 1, wherein the joint source-channel encoder circuit is further configured to
    generate compression indicator information for the received data, the compression indicator information indicating whether the received data is uncompressible data; and
    store the compression indicator information in association with the source encoded data in the memory device.

3. The memory controller of claim 2, wherein the compression indicator information is a flag bit that is set or reset according to whether the received data is compressible data.

4. The memory controller of claim 1, wherein the joint source-channel encoder circuit is further configured to
    source encode the received data according to a first source encoding algorithm; and
    determine whether the received data is uncompressible data based on a comparison between a size of the source encoded data and a size of the received data.

5. The memory controller of claim 4, wherein the joint source-channel encoder circuit is further configured to determine that the received data is uncompressible data if the size of the source encoded data is greater than or equal to the size of the received data.

6. The memory controller of claim 4, wherein the joint source-channel encoder circuit is further configured to source encode the received data according to a second source encoding algorithm if the received data is uncompressible data, the second source encoding algorithm being the distributed source encoding algorithm.

7. The memory controller of claim 6, wherein the distributed source encoding algorithm is a distributed arithmetic source encoding algorithm.

8. The memory controller of claim 4, wherein the first source encoding algorithm is an arithmetic encoding algorithm.

9. The memory controller of claim 1, wherein the error correction coding is low-density parity check (LDPC) correction coding.

10. A memory controller comprising:
    a joint source-channel decoder circuit configured to,
        read data from a memory device,
        perform source decoding of the read data between iterations of error correction coding of the read data, the source decoding of the read data being performed independent of whether the read data is compressed data, and
        output the read data to at least one of a buffer memory and a storage device interface.

11. The memory controller of claim 10, wherein the joint source-channel decoder circuit is further configured to perform one of a nonoverlapped source decoding algorithm and a distributed source decoding algorithm between the iterations of the error correction coding based on whether the read data is compressed data.

12. The memory controller of claim 11, wherein the joint source-channel decoder circuit is further configured to perform the distributed source decoding algorithm between the iterations of the error correction coding if the read data is not compressed data.

13. The memory controller of claim 11, wherein the distributed source decoding algorithm is a distributed arithmetic source decoding algorithm using a model in which the error interval is greater than the overlapped interval.

14. The memory controller of claim 11, wherein the joint source-channel decoder circuit is further configured to determine whether the read data is compressed data based on compression indicator information stored in association with the read data, the compression indicator information indicating whether the read data is compressed data.

15. The memory controller of claim 14, wherein the compression indicator information is a flag bit.

16. The memory controller of claim 10, further comprising:
    a joint source-channel encoder circuit configured to,
        source encode received data independent of whether the received data is compressible data,
        perform error correction coding on the source encoded data; and
        store the source encoded data in the memory device.

17. A storage device comprising:
    a memory device; and
    a memory controller including a joint source-channel decoder circuit, the joint source-channel decoder circuit being configured to,
        read data from the memory device,
        perform source decoding of the read data between iterations of error correction coding of the read data, the source decoding of the read data being performed independent of whether the read data is compressed data, and
        output the read data to at least one of a buffer memory and a storage device interface.

18. The storage device of claim 17, wherein the memory controller further includes a joint source-channel encoder circuit, the joint source-channel encoder circuit being configured to,
    source encode received data independent of whether the received data is compressible data,
    perform error correction coding on the source encoded data; and
    store the source encoded data in the memory device.

19. The storage device of claim 17, wherein the memory device is a nonvolatile memory device.

* * * * *